(12) United States Patent
Xu et al.

(10) Patent No.: US 10,141,271 B1
(45) Date of Patent: Nov. 27, 2018

(54) SEMICONDUCTOR DEVICE HAVING ENHANCED HIGH-FREQUENCY CAPABILITY AND METHODS FOR MAKING SAME

(71) Applicant: Coolstar Technology, Inc., Sunnyvale, CA (US)

(72) Inventors: Shuming Xu, Sunnyvale, CA (US); Yi Zheng, Sunnyvale, CA (US)

(73) Assignee: COOLSTAR TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 15/462,355

(22) Filed: Mar. 17, 2017

(51) Int. Cl.
*H01L 23/552* (2006.01)
*H01L 21/70* (2006.01)
*H01L 21/48* (2006.01)
*H01L 23/00* (2006.01)
*H01L 23/66* (2006.01)

(52) U.S. Cl.
CPC .......... *H01L 23/552* (2013.01); *H01L 21/485* (2013.01); *H01L 21/4853* (2013.01); *H01L 23/66* (2013.01); *H01L 24/16* (2013.01); *H01L 2224/16225* (2013.01); *H01L 2924/1421* (2013.01); *H01L 2924/3025* (2013.01)

(58) Field of Classification Search
CPC ..... H01L 23/552; H01L 23/66; H01L 21/485; H01L 21/4853; H01L 24/16; H01L 2224/16225; H01L 2924/1421; H01L 2924/3025

USPC .......................................... 257/659; 438/612
See application file for complete search history.

(56) References Cited

U.S. PATENT DOCUMENTS

| | | | |
|---|---|---|---|
| 2003/0015772 A1 | 1/2003 | Ivanov et al. | |
| 2003/0148598 A1* | 8/2003 | Tu | H01L 21/76 438/612 |
| 2005/0221601 A1* | 10/2005 | Kawano | H01L 21/76898 438/622 |
| 2008/0073747 A1 | 3/2008 | Chao et al. | |
| 2010/0078771 A1* | 4/2010 | Barth | H01L 21/76898 257/621 |

* cited by examiner

*Primary Examiner* — Cuong Q Nguyen
*Assistant Examiner* — Tong-Ho Kim
(74) *Attorney, Agent, or Firm* — Hoffmann & Baron, LLP

(57) ABSTRACT

A method of reducing electromagnetic interference in a semiconductor device includes: forming at least one functional circuit in a substrate of the semiconductor device; forming an integrated micro-shielding structure in the semiconductor device, the micro-shielding structure extending vertically through the substrate between a front surface and a back surface of the substrate and surrounding the functional circuit, the micro-shielding structure being configured to reduce radio frequency (RF) emissions in the semiconductor device and/or RF coupling between different functional parts of the functional circuit.

20 Claims, 11 Drawing Sheets

SEMICONDUCTOR DEVICE HAVING ENHANCED HIGH-FREQUENCY CAPABILITY AND METHODS FOR MAKING SAME

FIELD

The present invention relates generally to semiconductor devices, and more particularly to semiconductor devices having enhanced high frequency capability, and methods of making same.

BACKGROUND

For mobile applications, including, but not limited to, smart phones, tablets, and the like, radio frequency (RF) power amplifiers (PAs) are typically employed. Some basic requirements for RF power amplifiers used in such mobile applications are high gain, high linearity and high efficiency. Furthermore, it is often desirable to have different devices, such as, for example, PAs, low-noise amplifiers (LNAs), etc., integrated in the same package or on the same die. However, concerns about electromagnetic interference (EMI) between the different devices have presented significant challenges to the integration of such devices on the same die or in the same package. This interference is especially severe for higher frequency and higher power applications.

One source of EMI is inductor antenna effects, while interference paths are generally through free space or the substrate. There are various known approaches that have been used to reduce EMI. For example, one way to reduce EMI between devices is to physically separate the devices from one another and house them in different shielded packages. As a result, compared to monolithic integration, the multiple discrete devices consume more space, are more expensive and more complex to assemble, thus significantly increasing cost. Another approach is to employ external conductive layers over the die or packages, which requires EMI sources to be separated into different die from other system components, and each component die individually shielded. This results in a complex manufacturing process which not only increases cost but makes it difficult to miniaturize the system.

SUMMARY

One or more embodiments of the present invention provide techniques for enhancing high-frequency performance in a semiconductor device by reducing electromagnetic interference in the device in a manner which does not add significant cost to the device.

In accordance with one embodiment, a method of reducing electromagnetic interference in a semiconductor device includes: forming one or more functional circuits in a substrate of the semiconductor device; forming an integrated micro-shielding structure in the semiconductor device, the micro-shielding structure extending vertically through the substrate between a front surface and a back surface of the substrate and surrounding the one or more functional circuits, the micro-shielding structure being configured to reduce RF emissions in the semiconductor device and/or RF coupling between different functional parts of the one or more functional circuits.

In accordance with another embodiment, a semiconductor device includes a substrate, at least one functional circuit formed in the substrate, and an integrated micro-shielding structure formed in the semiconductor device. The micro-shielding structure extends vertically through the substrate between a front surface and a back surface of the substrate and surrounds the functional circuit. The micro-shielding structure is configured to reduce RF emissions in the semiconductor device and/or RF coupling between different functional parts of the functional circuit.

Techniques according to embodiments of the present invention provide substantial beneficial technical effects. By way of example only and without limitation, one or more embodiments provide techniques for improving high-frequency performance in a semiconductor device having one or more of the following advantages, among other benefits:

integrated shields in accordance with embodiments of the invention effectively reduce EMI coupling through a substrate of the device in a manner which is not feasible using conventional external shields;

enables integration of RF and digital or analog control circuits on the same substrate;

proximity to the EMI emitter and susceptible components offers a more effective EMI insulation as compared to package level shielding or printed circuit board (PCB) level shielding;

provides an effective means of EMI shielding for chip scale packaging (CSP) where the semiconductor die is mounted directly on the PCB board rather than being encased by molding compound.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1A:
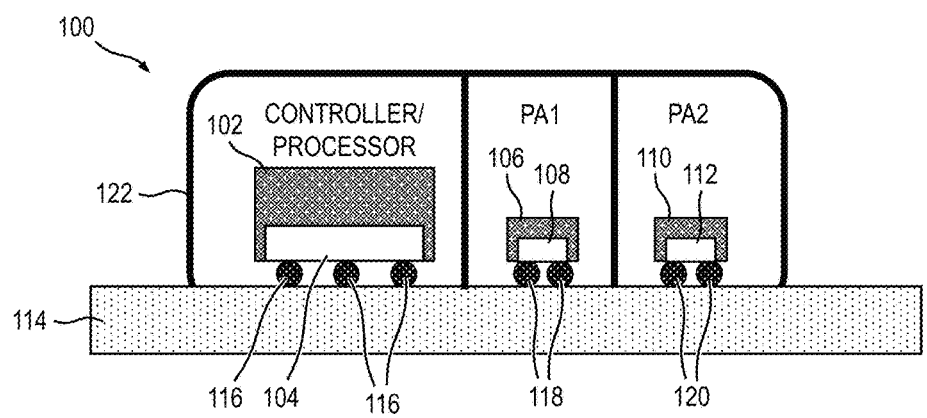
FIGS. 1A and 1B are cross-sectional views conceptually depicting at least a portion of packaged semiconductor devices which incorporate different external EMI shielding techniques.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative semiconductor devices, and methods of forming such devices, that are fabricated having integrated RF micro-shielding structures designed to reduce electromagnetic interference (EMI) in the device. It is to be appreciated, however, that the invention is not limited to the specific methods and/or devices illustratively shown and described herein. Rather, aspects of the present disclosure relate more broadly to techniques for providing enhanced high-frequency performance in a semiconductor device. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

Although the overall fabrication method and devices formed thereby, as will be described in further detail herein below, are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are hereby incorporated by reference herein. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit (IC) devices may not be explicitly shown in a given figure for economy of description. This does not imply, however, that the semiconductor layer(s) and/or region(s) not explicitly shown are omitted in the actual integrated circuit device.

As previously stated, semiconductor devices, particularly high-speed power semiconductor devices, generate heat during their use which must be removed in order to prevent performance degradation and/or consequent failure of the device. In the case of an encapsulated die, heat transfer is typically accomplished by providing a thermal conduction path between the die and the device package. In a flip-chip device arrangement, however, where the active surface of the die generating a predominate portion of the heat is not proximate to an external wall of the package, heat must be conducted through a substrate of the device, which is generally encapsulated by a molding compound that exhibits poor thermal conduction.

FIG. 1A is a cross-sectional view conceptually depicting at least a portion of a packaged semiconductor device 100 which incorporates external EMI shielding. The device 100 comprises a first discrete device 102 including a first die 104, a second discrete device 106 including a second die 108, and a third discrete device 110 including a third die 112. The first, second and third discrete devices 102, 106 and 110 are connected together on a common package substrate/carrier 114 using connection structures, 116, 118 and 120, respectively. The connection structures 116, 118, 120, in this embodiment, are implemented as solder balls, for example in a controlled collapse chip connection (C4) flip-chip arrangement, whereby under bump metallurgy (UBM) sites (not explicitly shown, but implied) on each of the dies 104, 108, 112 are electrically connected to corresponding UBM sites on the substrate 114 via the C4 solder balls. In place of solder balls, electroplated copper pillars or solder arrays can also be used. In this device 100, a conductive (e.g., metal) shield can 122 is placed over the discrete devices 102, 106, 110 and between adjacent devices and attached to the substrate 114 as shown in order to reduce EMI between the separate devices. For a multiple-component system, each component is enclosed inside an individual shield can.

Figure 1B:
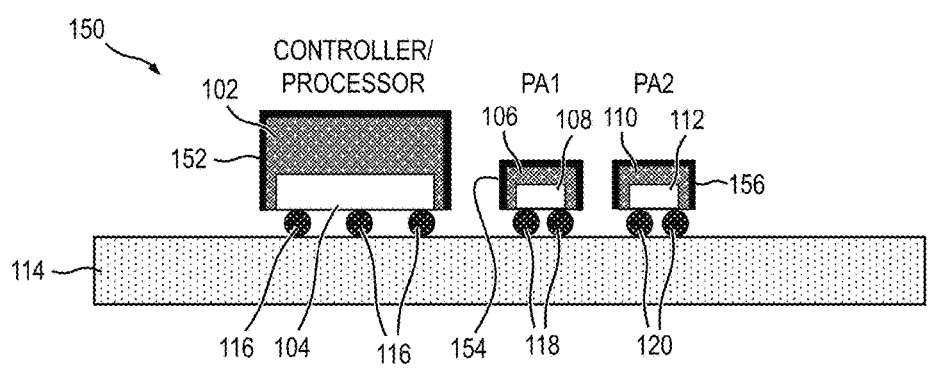

FIG. 1B is a cross-sectional view conceptually depicting at least a portion of a packaged semiconductor device 150 which utilizes a different external EMI shielding methodology compared to the semiconductor device 100 shown in FIG. 1A. Specifically, rather than using a can shield placed over all of the discrete devices 102, 106, 110, as used by semiconductor device 100, the semiconductor device 150 employs a conductive (e.g., metal) shield layer individually formed over each of the discrete devices. More particularly, the first discrete device 102 includes a first shield layer 152 conformally formed on an upper surface and sidewalls of the first device, the second discrete device 106 includes a second shield layer 154 conformally formed on an upper surface and sidewalls of the second device, and the third discrete device 110 includes a third shield layer 156 conformally formed on an upper surface and sidewalls of the third device. Unfortunately, however, the external shielding approaches shown in FIGS. 1A and 1B suffer the same limitations in that the discrete RF components cannot be integrated into the same die as interference-sensitive components such as, for example, low noise amplifiers, receivers, controllers, and the like.

Aspects of the present invention address one or more problems of reducing EMI in a semiconductor device by beneficially providing an integrated micro-shielding structure formed within the die and configured to shield RF interference generated by RF components and/or prevent RF interference from being injected into interference-sensitive components fabricated on a common substrate. This technique, according to one or more embodiments of the invention, beneficially facilitates the integration of multiple RF components and RF-sensitive components on the same die.

Figure 2A:
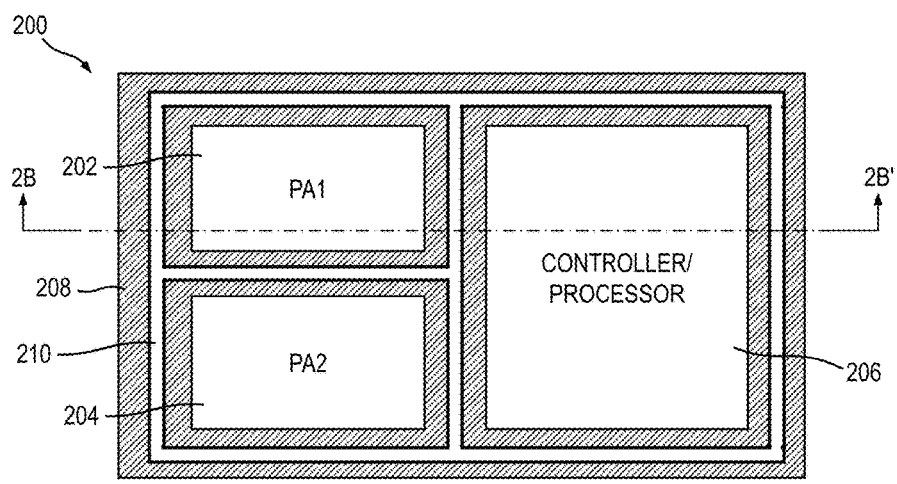
FIGS. 2A through 2C depict at least a portion of an exemplary semiconductor device comprising an integrated micro-shielding structure, according to an embodiment of the present invention.
Figure 2B:
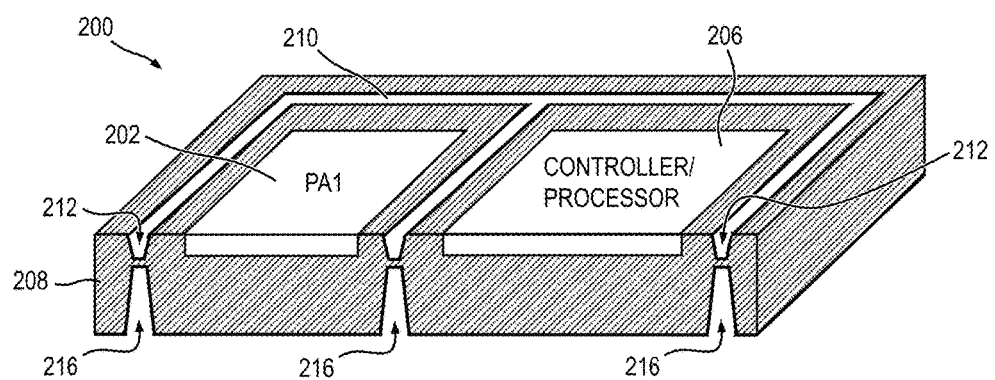
Figure 2C:
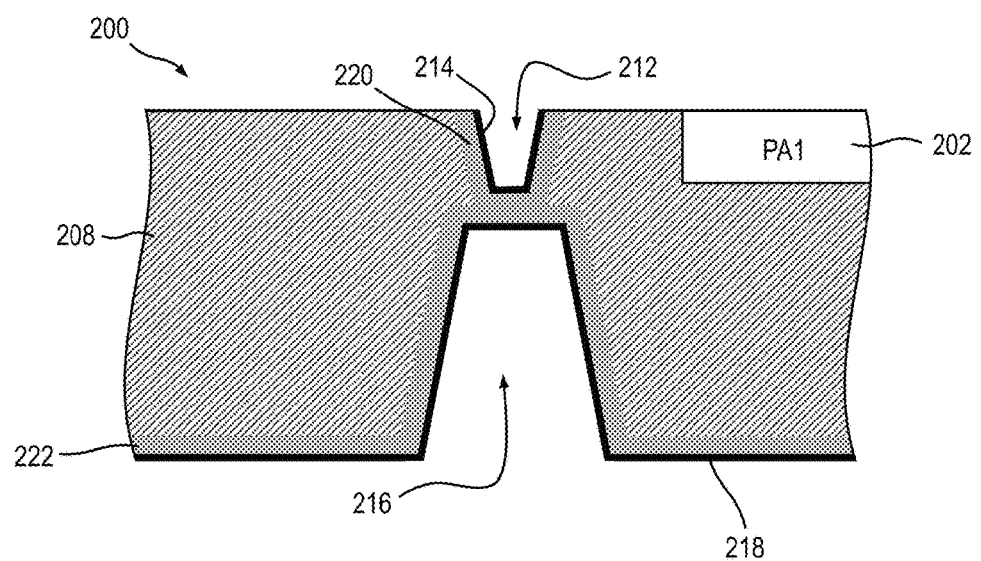

FIGS. 2A through 2C illustrate at least a portion of an exemplary semiconductor device 200 having an integrated micro-shielding structure, according to an embodiment of the invention. FIG. 2A is a top plan view of the semiconductor device 200, FIG. 2B is a cross-sectional isometric projection of the semiconductor device taken along line 2B-2B' in FIG. 2A, and FIG. 2C is a cross-sectional view of the semiconductor device showing further details of the integrated micro-shielding structure. With reference to FIGS. 2A through 2C, the semiconductor device 200 includes three functional blocks, namely, a first RF power amplifier (PA1) 202, a second RF power amplifier (PA2) 204 and a controller/processor 206, integrated on the same substrate 208. The device 200 further comprises an integrated micro-shielding structure 210 surrounding each of the functional blocks.

The micro-shielding structure 210, in this embodiment, comprises one or more shallow trenches 212 formed in an upper surface of the substrate 208 during front-side wafer processing and surrounds at least the RF blocks 202 and 204, and optionally surrounds each of the functional blocks in the substrate. The trenches 212 are formed, in one or more embodiments, using standard patterning and etching, although other methodologies for forming the trenches are similarly contemplated. After forming the shallow trenches 212, a layer of metal 214, or alternative conductive layer, is formed, such as, for example, by a deposition process (e.g., metal deposition), on sidewalls and a bottom of the shallow trenches. The metal layer 214 is preferably electrically connected to ground at one or more locations (not explicitly shown, but implied).

The micro-shielding structure 210 further includes one or more deep trenches 216 which are patterned and formed on the backside of the wafer, preferably after the front-side wafer processing has been completed, such as during back-end processing. A metal layer 218, or alternative conductive layer, is formed, such as, for example, by a deposition process (e.g., metal deposition), on sidewalls and a bottom of the deep trenches 216. The front and backside metal layers 214 and 218, respectively, can be electrically connected, such as, for example, by first and second heavily-doped regions 220 and 222, respectively, surrounding the shallow and deep trenches 212 and 216, respectively, or by direct connection through conductive vias or the like (not explicitly shown, but implied). In one or more embodiments wherein the front-side and backside trenches are not electrically connected (i.e., when heavily-doped regions 220, 222 or conductive vias are not employed), a maximum vertical spacing (i.e., gap size) between the front-side shallow trenches 212 and the backside deep trenches 216 is configured to be significantly less, such as 100 µm, than a wavelength of the RF signals being isolated. In this manner, the functional blocks and/or circuit components in different areas of the die are RF isolated and the EMI through the substrate is blocked, or at least significantly reduced, by these integrated micro-shielding structures.

Figure 3:
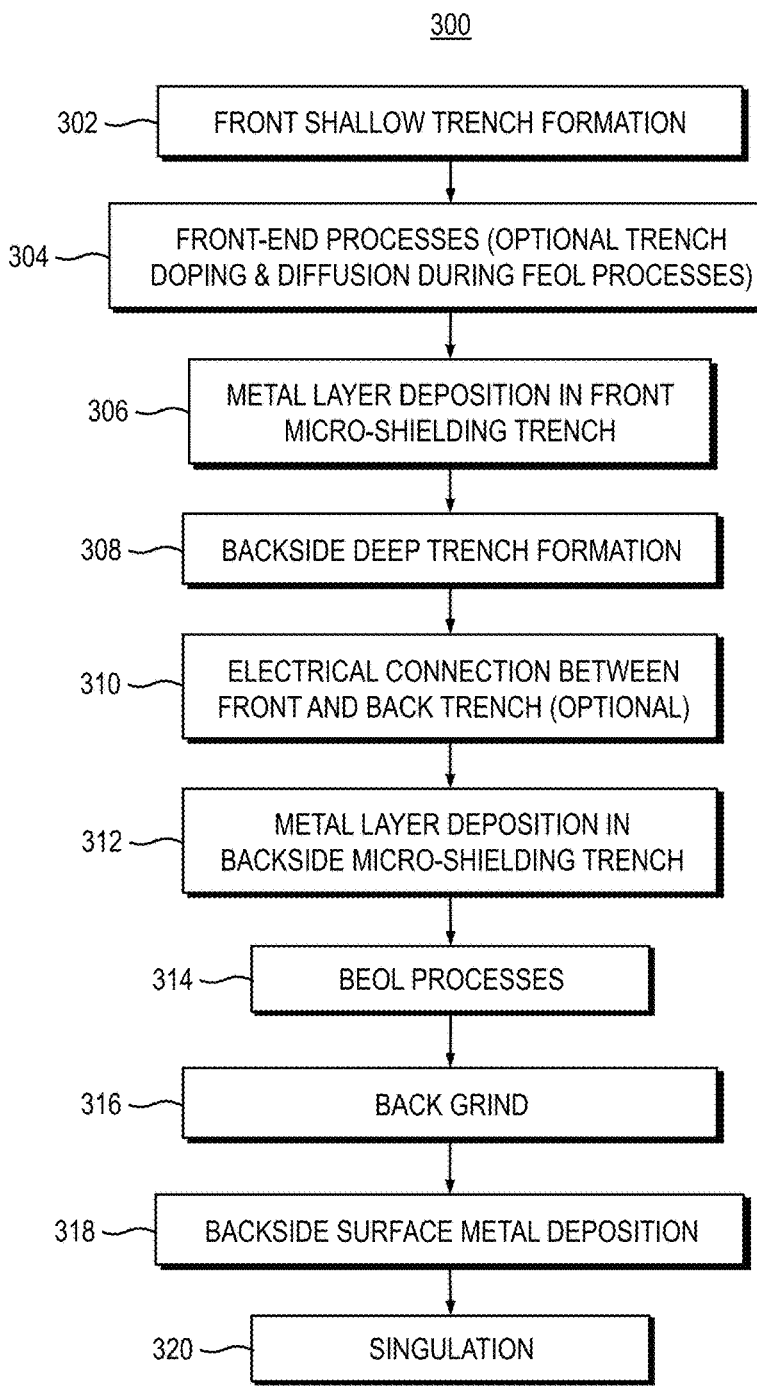
FIG. 3 is a flow diagram depicting an exemplary method of forming the semiconductor device shown in FIGS. 2A through 2C, according to an embodiment of the present invention.

FIG. 3 is a flow diagram depicting at least a portion of an exemplary method 300 of forming the semiconductor device 200 shown in FIGS. 2A through 2C, according to an embodiment of the invention. The method 300 includes forming shallow trenches on the front side of the wafer in step 302. Front-end processing (e.g., front-end-of-the-line (FEOL) processes) is performed in step 304 to complete the fabrication of the functional blocks (e.g., PA1 202, PA2 204, and Controller/Processor 206) and/or other circuit components in the die. Optionally, in step 304, an impurity (e.g., boron, phosphorous, etc.) of a prescribed conductivity type and concentration level (e.g., about $10^{16}$ to about $10^{19}$ atoms per cubic centimeter) is implanted through the shallow trenches 212 (e.g., using a photolithographic mask and an ion implantation process), followed by a diffusion process, to form the first heavily-doped region 220. Next, a conductive material (e.g., metal) is deposited on a bottom and sidewalls of the front trenches 212 in step 306 to complete a front-side portion of the micro-shielding structure 210.

In step 308, deep trenches 216 are formed in a back surface of the substrate/wafer 208. The deep trenches 216 may be formed using a standard patterning and etching process, as will become apparent to those skilled in the art. Optionally, in step 310, an impurity of a prescribed conductivity type and concentration level is implanted through the deep trenches 216 (e.g., using a photolithographic mask and ion implantation), followed by a diffusion process, to form the second heavily-doped region 222. The second heavily-doped region 222 is formed in such a manner that it is essentially contiguous with the first heavily-doped region 220 to thereby form an electrical connection between the front and backside trenches 212 and 216, respectively. Next, in step 312, a conductive material (e.g., metal) is deposited on a bottom and sidewalls of the backside trenches 216 to complete a backside portion of the micro-shielding structure 210. Alternatively, the heavily-doped region 222 can be formed by depositing phosphorous containing layers, acting as phosphorous sources, followed by anneal. The layers can be phosphorous glass made by phosphoryl chloride, or phosphorous oxychloride, ($POCl_3$) oxidation or phosphorous-doped silicon glass (PSG) as a doping source. Choice of the methods used may ultimately be driven by equipment availability.

In step 314, backend processing (e.g., back-end-of-the-line (BEOL) processes) are completed, followed by a back grind process in step 316 to reduce a thickness of the substrate 208. Following the back grind step, a conductive material (e.g., metal) is formed on the back surface of the substrate 208 as part of a backside surface metal deposition process in step 318. This backside surface metal layer 218 is electrically connected to the conductive material lining the backside trenches 216. After completion of the backside surface metal deposition, a singulation process is performed in step 320 to separate the wafer into individual die for packaging.

Figure 4A:
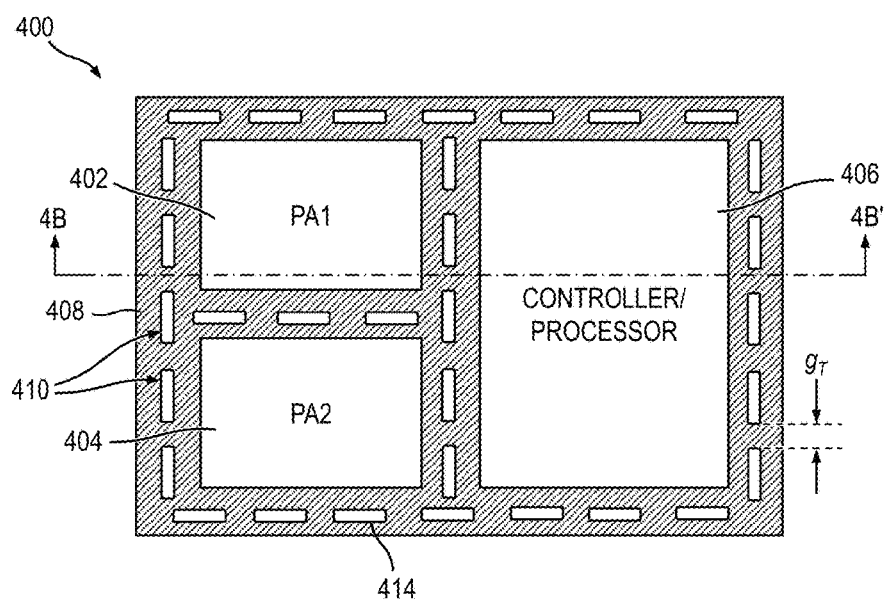
FIGS. 4A and 4B are top plan and cross-sectional views, respectively, depicting at least a portion of an exemplary semiconductor device comprising an integrated non-continuous micro-shielding structure, according to an embodiment of the present invention.
Figure 4B:
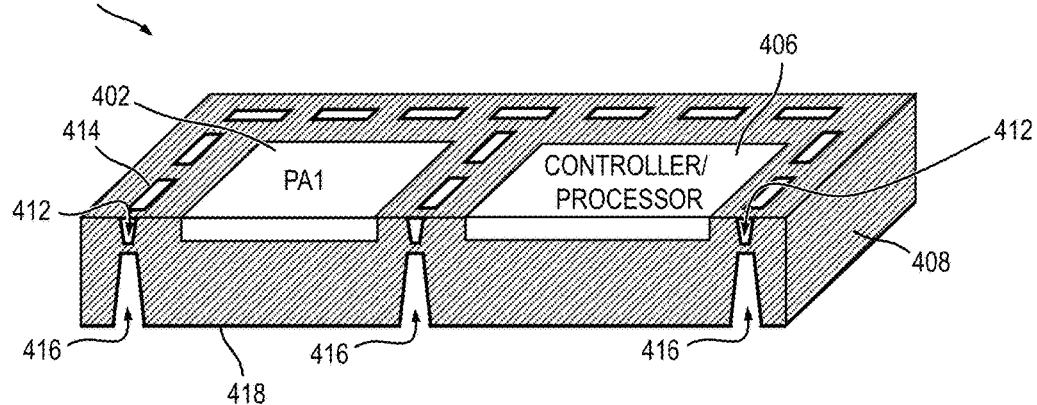

Although the micro-shielding structure 210 shown in the illustrative embodiment of FIGS. 2A through 2C was formed as a continuous trench, it is to be appreciated that a micro-shielding structure that is non-continuous may also be formed, according to other aspects of the invention. By way of example only and without limitation, FIGS. 4A and 4B are top plan and cross-sectional views, respectively, depicting at least a portion of an exemplary semiconductor device 400 comprising an integrated non-continuous micro-shielding structure, according to an embodiment of the invention; the cross-sectional view of FIG. 4B is taken along line 4B-4B' in FIG. 4A. The semiconductor device 400 includes three functional blocks, namely, a first RF power amplifier (PA1) 402, a second RF power amplifier (PA2) 404 and a controller/processor 406, integrated on the same substrate 408. The device 400 further comprises an integrated micro-shielding structure 410 surrounding each of the functional blocks.

The micro-shielding structure 410, in this embodiment, comprises a plurality of shallow trench segments 412 formed in an upper surface of the substrate 408 during front-side wafer processing and preferably surrounds each of the functional blocks in the substrate. In one or more embodiments, the micro-shielding structure 410 may only surround a subset of the functional blocks, such as those circuit components particularly sensitive to EMI. The shallow trench segments 412 are formed, in one or more embodiments, in a manner consistent with the formation of the continuous shallow trench 212 depicted in FIGS. 2A and 2B, such as, for example, using standard patterning and etching, although other methodologies for forming the trench segments are contemplated. After forming the shallow trench segments 412, a layer of conductive material (e.g., metal) 414 is formed, such as, for example, by a deposition process (e.g., metal deposition), on sidewalls and a bottom of the shallow trench segments so as to line the shallow trench segments. The conductive layer 414 is preferably electrically connected to ground at one or more locations (not explicitly shown, but implied).

The micro-shielding structure 410 further includes a plurality of deep trench segments 416 which are patterned and formed on the backside of the wafer, preferably after front-side wafer processing has been completed. A conductive (e.g., metal) layer 418 is formed, such as, for example, by a deposition process (e.g., metal deposition), on sidewalls and a bottom of the deep trench segments 416 so as to line the deep trench segments. The front and backside metal layers 414 and 418, respectively, can be electrically connected, such as, for example, by first and second heavily-doped regions (not explicitly shown, but consistent with heavily-doped regions 220 and 222 shown in FIG. 2C) surrounding the shallow and deep trench segments 412 and 416, respectively, or by direct connection through conductive vias or the like (not explicitly shown, but implied). In this manner, the functional blocks and/or circuit components in different areas of the die are RF isolated and the EMI through the substrate is at least significantly reduced.

In accordance with embodiments of the invention, either the front-side trench (e.g., shallow trench 412), or the backside trench (e.g., deep trench 416), or both the front-side and backside trenches, can be non-continuous. This non-continuous trench approach has the benefit, as compared to utilizing a continuous trench as in the exemplary semiconductor device 200 shown in FIGS. 2A through 2C, of providing better substrate mechanical strength.

For effective RF isolation and reduction of EMI in the semiconductor device 400, the shallow and deep trench segments 412 and 416, respectively, are configured to have a maximum spacing (i.e., gap size), $g_r$, between adjacent trench segments that is smaller than a wavelength of the RF signals generated by the functional blocks 402, 404, 406 being isolated by the micro-shielding structure 410. For example, the maximum spacing between adjacent trench segments 412 or 416 for effectively shielding RF signals in a range of about 1-20 GHz is about 10-200 µm. Furthermore, corresponding shallow and deep trench segments 412, 416 may be electrically connected, in one or more embodiments, by forming a heavily-doped region (not explicitly shown, but implied) proximate to the bottom and sidewalls of the trench segments and extending outwardly therefrom, in a manner consistent with the heavily-doped regions 220 and 222 shown in FIG. 2C.

Figure 5A:
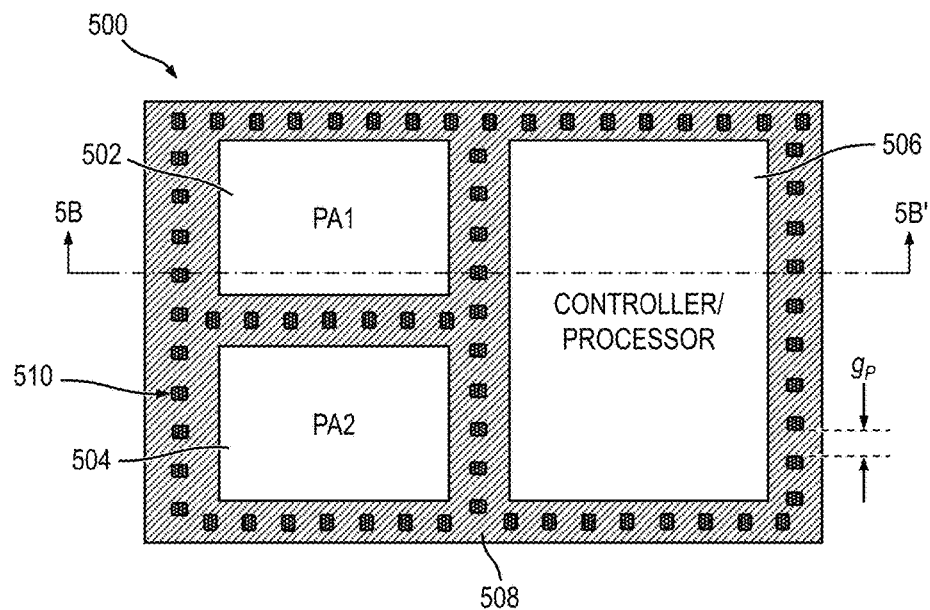
FIGS. 5A and 5B are top plan and cross-sectional views, respectively, depicting at least a portion of an exemplary semiconductor device comprising an integrated non-continuous micro-shielding structure, according to another embodiment of the present invention.
Figure 5B:
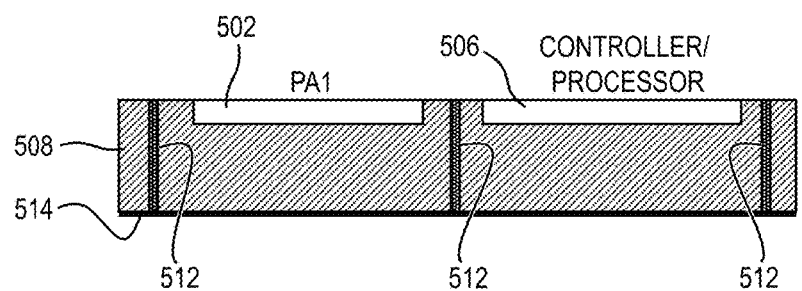

FIGS. 5A and 5B are top plan and cross-sectional views, respectively, depicting at least a portion of an exemplary semiconductor device 500 comprising an integrated non-continuous micro-shielding structure, according to another embodiment of the invention; the cross-sectional view of FIG. 5B is taken along line 5B-5B' in FIG. 5A. The device 500 includes three functional blocks, namely, a first RF power amplifier (PA1) 502, a second RF power amplifier (PA2) 504 and a controller/processor 506, integrated on the same substrate 508. The device 500 further comprises an integrated non-continuous micro-shielding structure 510 surrounding the functional blocks.

The micro-shielding structure 510, in this embodiment, comprises a plurality of conductive (e.g., copper) pillars 512 formed through the substrate 508 between upper and backside surfaces of the substrate. The pillars 512 may be formed, in one or more embodiments, as through silicon vias (TSVs), although alternative means of forming the pillars are similarly contemplated. The pillars 512, which can be formed after front-side and backside wafer processing (e.g., FEOL and BEOL processes) has been completed, are preferably placed around a periphery of each of the functional blocks in the substrate, as depicted in FIG. 5A. In one or more embodiments, the pillars 512 may only surround a subset of the functional blocks, such as circuitry that is particularly sensitive to RF EMI. A conductive (e.g., metal) layer 514 is formed on a back surface of the substrate 508 which electrically connects to the pillars 512. The conductive layer 514, which can be formed using a metal deposition process or the like, is electrically connected to ground at one or more locations (not explicitly shown, but implied) in one or more embodiments.

As in the case for the non-continuous micro-shielding structure embodiment shown in FIG. 4A, for effective RF isolation and reduction of EMI in the semiconductor device 500, the conductive pillars 512 are preferably configured to have a maximum spacing (i.e., gap size), $g_p$, between adjacent pillars that is smaller than a wavelength of the RF signals generated by the functional blocks 502, 504, 506 being isolated by the micro-shielding structure 510. For example, the maximum spacing between adjacent pillars 512 for effectively shielding RF signals in a range of about 1-20 GHz is about 10-100 µm.

Figure 6:
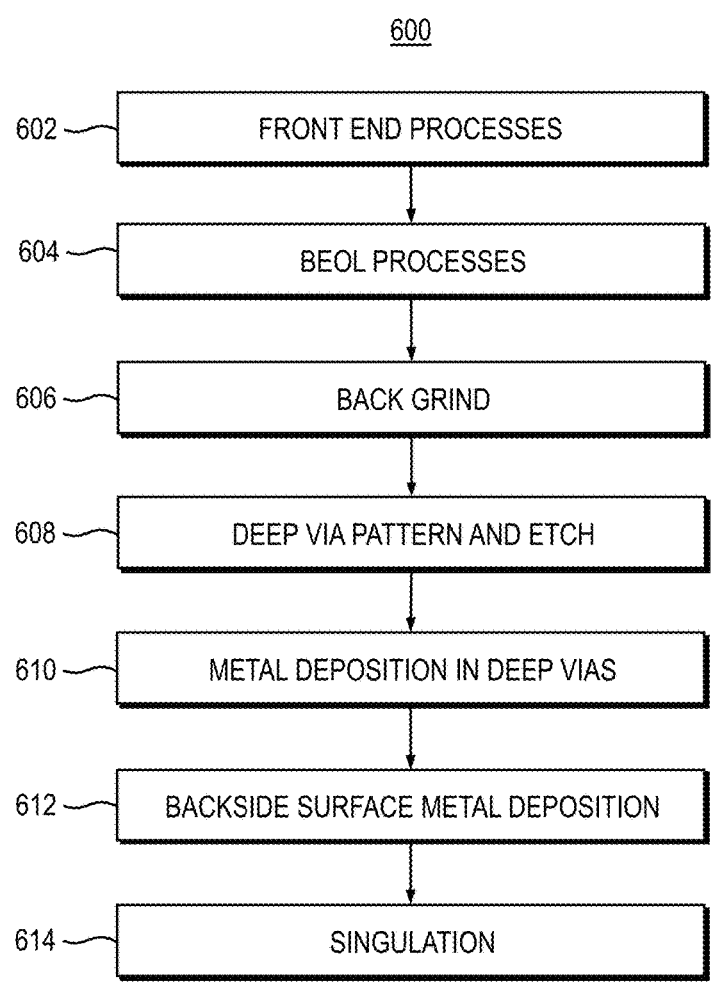
FIG. 6 is a flow diagram depicting at least a portion of an exemplary method of forming the illustrative semiconductor device shown in FIGS. 5A and 5B, according to an embodiment of the present invention.

FIG. 6 is a flow diagram depicting at least a portion of an exemplary method 600 of forming the illustrative semiconductor device 500 shown in FIGS. 5A and 5B, according to an embodiment of the invention. With reference now to FIG. 6, the method 600 includes performing wafer front-end (FEOL) processes in step 602, which involves transferring geometric mask patterns (representing the circuit design) onto an upper surface of the wafer using lithography, and backside (BEOL) processes in step 604, which involves connecting various circuit components on the wafer and packaging. After completion of the BEOL processes, back-grinding is performed in step 606 to planarize and thin the wafer. Semiconductor wafers are routinely thinned prior to dicing to aid the sawing operation and to allow the final assembled package thickness to be minimized. For semiconductor devices required to operate at high power levels, wafer thinning improves the ability to dissipate heat by lowering a thermal resistance of the die.

In step 608, deep via patterning and etching are performed on the backside of the wafer to fabricate the conductive pillars (e.g., 512 in FIGS. 5A and 5B) used to form the micro-shielding structure. In a TSV process, a mask is created using standard lithographic patterning of the backside of the wafer and the wafer is subsequently etched, such as, for example, using reactive ion etching (ME), plasma etching, or the like, to create deep vias (which may be, for example, through or non-through holes) through the substrate 508 having a relatively high aspect ratio (i.e., depth-to-width ratio). The vias are filled with a conductive material in step 610, such as, for example, copper, although other suitable conductive materials may be used (e.g., aluminum, gold, etc.), to form the conductive pillars/vias.

Once the vias have been filled with conductive material in step 610, a metal layer is deposited on the backside surface of the wafer in step 612. A planarization process may precede the metal layer deposition step, using, for example, chemical mechanical polishing (CMP) or the like, to planarize the backside of the wafer in preparation for the backside surface metal deposition. In step 614, a singulation process is performed to separate the wafer into respective dies.

A die including the micro-shielding structure formed in accordance with one or more embodiments can be packaged in various configurations. By way of example only and without limitation, the die can be packaged in a quad-flat-no-leads (QFN) package in the following manner, in one or more embodiments. During the front-side trench formation process, the trenches can be filled with metal or other materials, such as, for instance, polymer materials, to help wafer handling during backside trench processing. Similarly, in one or more embodiments, the backside trenches can be filled with polymer material, such as, for example, epoxy, polyimide (PI) or polybenzoxazole (PBO). After packaging and assembly processes, the polymer material can remain as a protection layer or be removed. For example, the die backside can be exposed, then polymer materials can be readily removed, for example, by solvent or a plasma ashing process, to become the final product. Plasma ashing is a process by which plasma cleaning is performed for the purpose of removing carbon. Plasma ashing is performed with oxygen gas.

Figure 7:
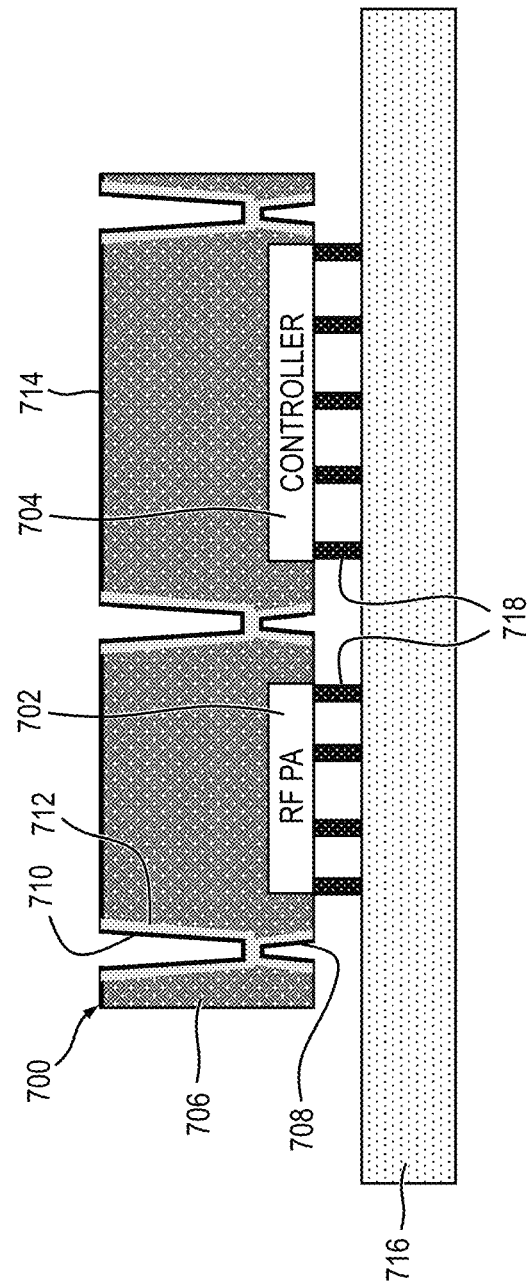
FIG. 7 is a cross-sectional view depicting at least a portion of an exemplary semiconductor device including a micro-shielding structure mounted to a PCB or other substrate, according to an embodiment of the present invention.

In accordance with one or more aspects of the invention, a die comprising a micro-shielding structure can be directly mounted onto a printed circuit board (PCB) by flip-chip wafer level packaging without the need of a shielding can (see FIG. 1A) or an external shielding coating (see FIG. 1B). FIG. 7 is a cross-sectional view depicting at least a portion of an exemplary semiconductor device 700 including a micro-shielding structure mounted to a PCB or other substrate, according to an embodiment of the invention. The device 700 includes an RF power amplifier (RF PA) 702 integrated with a controller 704 on a common substrate 706. The device 700 further includes a micro-shielding structure comprising one or more shallow trenches 708 formed in an upper surface of the substrate 706 during front-side wafer processing and one or more deep trenches 710 formed in a backside surface of the substrate during backside wafer processing. In a manner consistent with the formation of the micro-shielding structure shown in FIG. 2C, the micro-shielding structure in the device 700 optionally includes a heavily-doped region 712 which electrically connects the shallow trenches 708 with corresponding deep trenches 710 to thereby facilitate EMI shielding in the device, as previously described. A conductive (e.g., metal) layer 714 formed on the backside on the device 700 provides a means of grounding the micro-shielding structure.

In the embodiment shown in FIG. 7, the semiconductor device 700 is connected to a PCB 716, or other carrier, via a plurality of connection structures 718 in a flip-chip arrangement, for example during BEOL processing. The connection structures 718, which may comprise, for example, solder bumps, copper pillars, etc., electrically connect first connection sites formed on the front-side of the device 700 with corresponding second connection sites on the PCB 716. When solder bumps are employed as the connection structures 718, the connection sites may comprise UBM pads or the like. As stated previously, the front and backside trenches 708 and 710, respectively, can be electrically connected and then grounded to a PCB ground through one or more of the copper pillars or solder bumps. This approach allows the removal of conventional molding materials (e.g., thermoplastic encapsulant) around the die. Thus, using the integrated micro-shielding methodology according to aspects of the invention, a bare die may be advantageously attached to a PCB in a flip-chip arrangement without molding and without the necessity of an external metal can or other external conductive coating and yet still beneficially achieve reduced EMI in the device.

Figure 8:
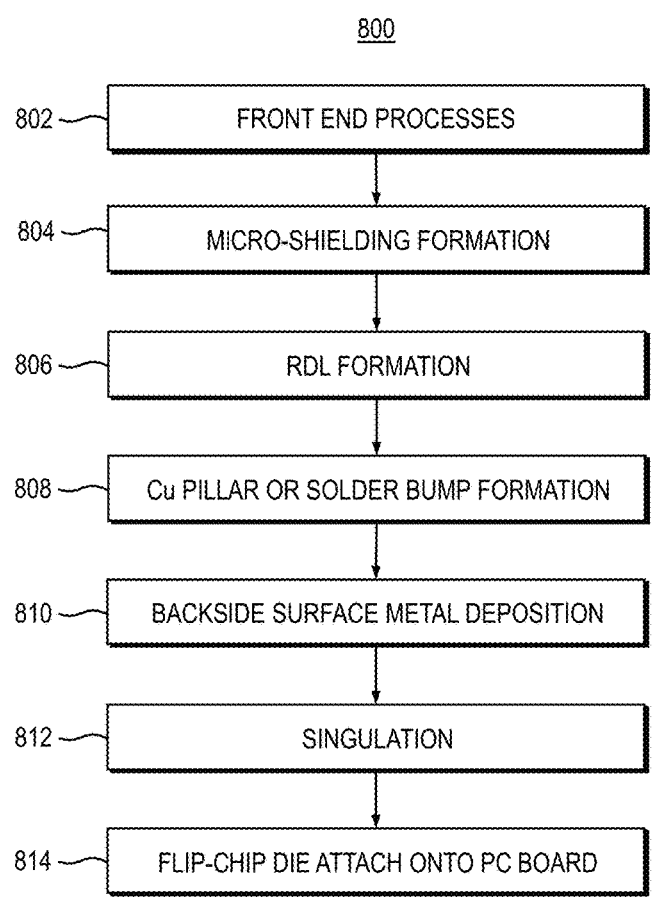
FIG. 8 is a flow diagram depicting at least a portion of an exemplary method of performing BEOL processing using a semiconductor device including a micro-shielding structure, according to an embodiment of the present invention.

FIG. 8 is a flow diagram depicting at least a portion of an exemplary method 800 of performing BEOL processing using a semiconductor device including a micro-shielding structure, according to an embodiment of the invention. With reference to FIG. 8, the method 800 includes performing front-end processes in a semiconductor device in step 802. In step 804, a front portion of the micro-shielding structure is formed in the device in a manner consistent with the formation of the micro-shielding structures shown in the illustrative embodiments of FIGS. 2A through 5B. Specifically, formation of the micro-shielding structure may, in one or more embodiments, comprise front shielding trench formation and metallization. In embodiments wherein the micro-shielding structure is implemented using an array of TSVs, as shown in FIGS. 5A through 6, front shielding trench formation and metallization may be omitted, since TSVs are preferably formed after front side processes are completed; so called "via last" process flow.

Step 806 includes formation of a redistribution layer (RDL), which generally involves relocating (i.e., redistributing) IC bond pads before flip-chip bumping. In some embodiments, RDL formation offers an attractive means of creating distributed power and ground contacts. Redistributed pads also transform off-chip connections from chip scale to board scale, as will become apparent to those skilled in the art. Next, copper pillars or solder bumps are formed in step 808 for providing electrical connection between the die and a PCB. The copper pillars or solder bumps may also be used to ground the micro-shielding structure at one or more points.

In step 810, a backside portion of the micro-shielding structure is formed in the device in a manner consistent with the formation of the micro-shielding structures shown in the illustrative embodiments of FIGS. 2A through 5B. Specifically, formation of the micro-shielding structure may, in one or more embodiments, comprise backside shielding trench formation and metallization (e.g., backside surface metal deposition). In embodiments wherein the micro-shielding structure is implemented using TSVs, as shown in FIGS. 5A through 6, the formation of TSVs is substituted for backside trench formation. It is to be appreciated that in one or more embodiments the micro-shielding structure may be formed using a combination of multiple different micro-shielding techniques; for example, the micro-shielding structure may comprise conductive vias (e.g., TSVs) and continuous and/or non-continuous trenches.

The wafer is separated into individual die during a singulation process in step 812. Singulation, in one or more embodiments, comprises dicing the wafer. Next, using a flip-chip die attach process in step 814, the die including the integrated micro-shielding structure is attached to the PCB or other carrier. As previously stated, no further steps are required (e.g., attaching an external shield can or metal coating/film) for reducing EMI in the device.

The illustrative micro-shielding methodology according to embodiments of the invention allows the omission of conventional molding materials around the die, as previously stated. One or more benefits of this approach compared to conventional shielding techniques include, but are not limited to: (i) superior RF isolation, as the EMI shielding structure is located in closer proximity to the devices; (ii) micro-shielding can be placed around the RF source to prevent EMI emission and/or it can be placed around RF-sensitive devices to prevent or reduce EMI injection; (iii) improved heat transfer from power devices, since molding materials, which generally have lower thermal conductivity compared to silicon, are omitted and are usually a major contributor of total junction-to-ambient thermal resistance.

Figure 9:
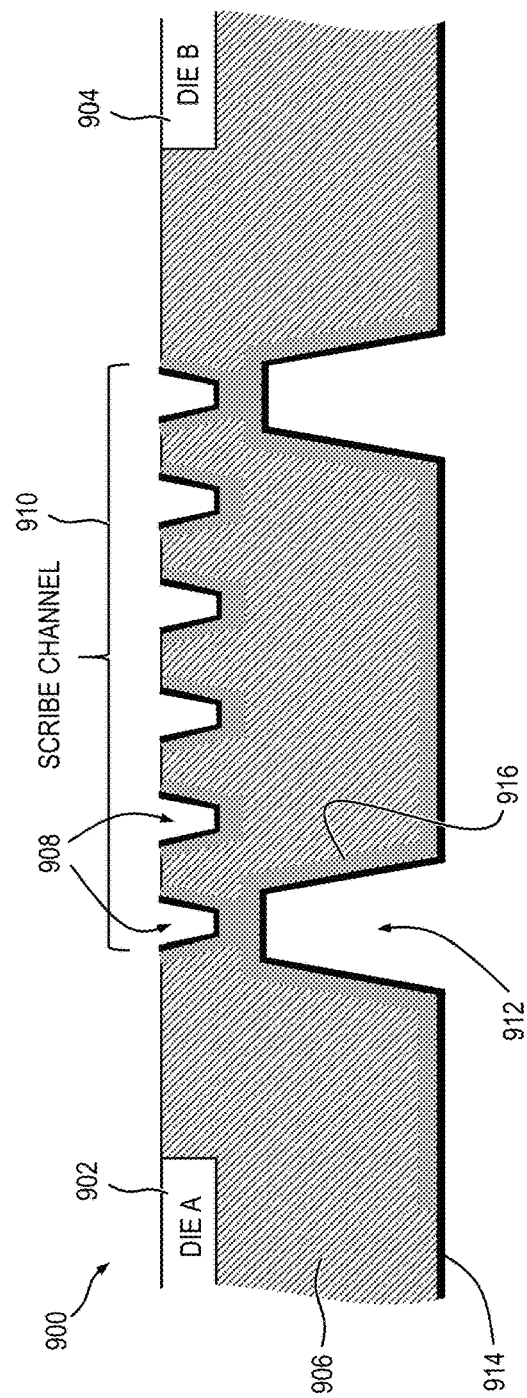
FIG. 9 is a cross-sectional view depicting at least a portion of an exemplary semiconductor device including shallow trenches formed in a scribe channel, according to an embodiment of the present invention.

Aspects of the invention can also be used to prevent silicon and other dielectrics from chipping or delaminating during wafer singulation. Specifically, FIG. 9 is a cross-sectional view depicting at least a portion of a semiconductor device 900 having a reduced likelihood of chipping or delamination during wafer singulation, according to an embodiment of the invention. The device 900 includes a first die (die A) 902 and a second die (die B) 904 formed in a wafer 906, proximate an upper surface of the wafer. The device 900 further includes a plurality of shallow trenches 908 formed in the front side of the wafer, in a scribe channel 910 of the wafer 906 laterally separating the first and second dies 902, 904.

Deep trenches 912 are formed in the backside of the wafer 906. The deep trenches 912, in this embodiment, are formed on outer edges of the scribe channel or line 910, beneath and vertically aligned with corresponding shallow trenches 908. Vertical alignment of the deep trenches 912 with corresponding shallow trenches 908 is preferred primarily in order to prevent the propagation of EMI through the substrate. A metal layer 914 is preferably formed on the backside of the wafer 906 and lining the bottom and sidewalls of the deep trenches 912, such as by using a metal deposition process. Likewise, a metal layer is preferably deposited on sidewalls and a bottom of the shallow trenches 908. Optionally, a heavily-doped region 916 may be formed, such as, for example, by impurity implantation and diffusion processes, proximate the bottom and sidewalls of the shallow and deep trenches. Thus, the shallow trenches 908 and deep trenches 912, in one or more embodiments, are formed in a manner consistent with the formation of the micro-shielding structure shown in FIG. 2C.

During wafer singulation, adjacent dies 902 and 904 are separated, such as by scribing and breaking or by sawing (e.g., using a wafer dicing saw) in the scribe channel 910. The presence of the metallized shallow and deep trenches 908 and 912, respectively, helps prevent micro-cracks generated by sawing from propagating into the substrate and forming macro-cracks, causing device failure, thus protects the silicon wafer from chipping or delamination during singulation.

Figure 10:
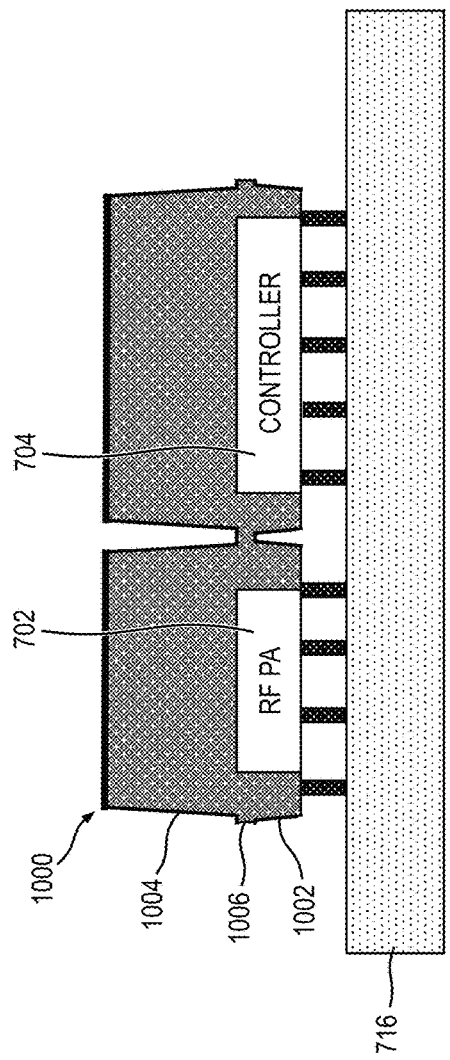
FIG. 10 is a cross-sectional view depicting at least a portion of a semiconductor device including integrated sidewall RF shielding after dicing, according to an embodiment of the invention.

FIG. 10 is a cross-sectional view depicting at least a portion of a semiconductor device 1000 including integrated conformal (the conformal EMI coating is on all five sides of the die, in one or more embodiments) outer RF shielding structure after dicing, according to an embodiment of the invention. With reference to FIGS. 9 and 10, after dicing (i.e., singulation), portions of the shallow and deep trenches 908 and 912, respectively, formed in the scribe channel 910 provide sidewall RF shielding for the diced semiconductor device 1000. More particularly, as shown in FIG. 10, a sidewall of the shallow trench 908 proximate an outer edge of the scribe channel 910 forms a first portion 1002 of a sidewall RF shielding structure of the device 1000, a sidewall of the deep trench 912 proximate the outer edge of the scribe channel forms a second portion 1004 of the sidewall RF shielding structure, and the heavily-doped region 916 between the shallow and deep trenches forms a third portion 1006 of the sidewall RF shielding structure. Using this approach in accordance with one or more aspects of the invention, EMI is further reduced with the use of additional external RF shielding structures.

Given the discussion thus far, it will also be appreciated that a method of reducing electromagnetic interference in a semiconductor device includes: forming at least one functional circuit in a substrate of the semiconductor device; forming an integrated micro-shielding structure in the semiconductor device, the micro-shielding structure extending vertically through the substrate between a front surface and a back surface of the substrate and surrounding the functional circuit, the micro-shielding structure being configured to reduce RF emissions in the semiconductor device and/or RF coupling between different functional parts of the functional circuit.

Given the discussion thus far, it will be appreciated that an exemplary semiconductor device having reduced electromagnetic interference includes a substrate, at least one functional circuit formed in the substrate, and an integrated micro-shielding structure formed in the semiconductor device. The micro-shielding structure extends vertically through the substrate between a front surface and a back surface of the substrate and surrounds the functional circuit. The micro-shielding structure is configured to reduce RF emissions in the semiconductor device and/or RF coupling between different functional parts of the functional circuit.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having active semiconductor devices integrated with passive components in accordance with one or more embodiments of the invention.

An integrated circuit in accordance with aspects of the present disclosure can be employed in essentially any application and/or electronic system where high-frequency power semiconductor devices (e.g., RF power amplifiers) are employed. Suitable systems and devices for implementing embodiments of the invention may include, but are not limited to, portable electronics (e.g., cell phones, tablet computers, etc.). Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "upper," "lower" and "back" are used to indicate relative positioning of elements or structures to each other when such elements are oriented in a particular manner, as opposed to defining absolute positioning of the elements.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method of reducing electromagnetic interference in a semiconductor device, comprising:
   forming at least one functional circuit in a substrate of the semiconductor device; and
   forming an integrated micro-shielding structure in the semiconductor device, the integrated micro-shielding structure extending vertically through the substrate between a front surface and a back surface of the substrate and surrounding the at least one functional circuit, the integrated micro-shielding structure being configured to reduce at least one of radio frequency (RF) emissions in the semiconductor device and RF coupling between different functional parts of the at least one functional circuit;
   wherein forming the integrated micro-shielding structure comprises:
      forming at least a first trench in the front surface of the substrate and extending partially through the substrate;
      forming a first conductive layer on at least a bottom and sidewalls of the first trench;
      forming at least a second trench in the back surface of the substrate and extending partially through the substrate, the second trench underlying at least a portion of the first trench, respective depths of the first and second trenches being configured such that the first and second trenches are separated from one another by a prescribed vertical spacing; and
      forming a second conductive layer on at least a bottom and sidewalls of the second trench;
      wherein the prescribed vertical spacing between the first and second trenches is configured to be smaller than a wavelength of RF signals being isolated by the integrated micro-shielding structure.

2. The method of claim 1, wherein the first trench is formed before front-end processing is started, and the second trench is formed after front-end processing has ended.

3. The method of claim 1, wherein forming an integrated micro-shielding structure comprises:
   forming a first plurality of trench segments in the front surface of the substrate and extending partially through the substrate;
   forming a first conductive layer on at least bottoms and sidewalls of the first plurality of trench segments;
   forming a second plurality of trench segments in the back surface of the substrate and extending partially through the substrate; and forming a second conductive layer on at least bottoms and sidewalls of the second plurality of trench segments.

4. The method of claim 3, wherein a maximum spacing between adjacent trench segments is configured to be smaller than a wavelength of RF signals being isolated by the integrated micro-shielding structure.

5. The method of claim 3, wherein forming an integrated micro-shielding structure further comprises:
   forming a first doped region proximate the first plurality of trench segments and extending into the substrate; and
   forming a second doped region proximate the second plurality of trench segments and extending into the substrate, the first and second doped regions forming a contiguous doped region configured to electrically connect the first plurality of trench segments with the second plurality of trench segments.

6. The method of claim 1, wherein forming an integrated micro-shielding structure comprises:
   forming a plurality of vias from the back surface of the substrate and passing vertically at least partially through the substrate; and
   filling the plurality of vias with a conductive material to form a plurality of conductive pillars.

7. The method of claim 6, wherein a maximum spacing between adjacent conductive pillars is configured to be smaller than a wavelength of RF signals being isolated by the integrated micro-shielding structure.

8. The method of claim 6, wherein the conductive pillars are formed after front-end processing has been completed.

9. The method of claim 1, further comprising forming a conductive layer on the back surface of the substrate, the conductive layer electrically connecting to the integrated micro-shielding structure and being configured to ground the integrated micro-shielding structure at one or more points through the semiconductor device.

10. The method of claim 1, wherein forming the integrated micro-shielding structure further comprises:
    forming a first doped region proximate the first trench and extending into the substrate; and
    forming a second doped region proximate the second trench and extending into the substrate, the first and second doped regions forming a contiguous doped region configured to electrically connect the first and second trenches.

11. A method of reducing electromagnetic interference in a semiconductor device, comprising:
    forming at least one functional circuit in a substrate of the semiconductor device; and
    forming an integrated micro-shielding structure in the semiconductor device, the integrated micro-shielding structure extending vertically through the substrate between a front surface and a back surface of the substrate and surrounding the at least one functional circuit, the integrated micro-shielding structure being configured to reduce at least one of radio frequency (RF) emissions in the semiconductor device and RF coupling between different functional parts of the at least one functional circuit;
    wherein forming the integrated micro-shielding structure comprises:
       forming a first trench in the front surface of the substrate and extending partially through the substrate;
       forming a first conductive layer on at least a bottom and sidewalls of the first trench;
       forming a second trench in the back surface of the substrate and extending partially through the substrate;
       forming a second conductive layer on at least a bottom and sidewalls of the second trench;
       forming a first doped region proximate the first trench and extending into the substrate; and
       forming a second doped region proximate the second trench and extending into the substrate, the first and second doped regions forming a contiguous doped region configured to electrically connect the first and second trenches.

12. A semiconductor device, comprising:
    a substrate;
    at least one functional circuit formed in the substrate; and
    an integrated micro-shielding structure formed in the semiconductor device, the integrated micro-shielding structure extending vertically through the substrate between a front surface and a back surface of the substrate and surrounding the at least one functional circuit, the integrated micro-shielding structure being configured to reduce at least one of radio frequency (RF) emissions in the semiconductor device and RF coupling between different functional parts of the at least one functional circuit;
    wherein the integrated micro-shielding structure comprises:
       a first trench formed in the front surface of the substrate and extending at least partially through the substrate;
       a first conductive layer formed on at least a bottom and sidewalls of the first trench;
       a second trench formed in the back surface of the substrate and extending partially through the substrate, the second trench underlying at least a portion of the first trench, respective depths of the first and second trenches being configured such that the first and second trenches are separated from one another by a prescribed vertical spacing; and
       a second conductive layer formed on at least a bottom and sidewalls of the second trench;
       wherein the prescribed vertical spacing between the first and second trenches is configured to be smaller than a wavelength of RF signals being isolated by the integrated micro-shielding structure.

13. The device of claim 12, wherein the integrated micro-shielding structure comprises:
    a first plurality of trench segments formed in the front surface of the substrate and extending partially through the substrate;
    a first conductive layer formed on at least bottoms and sidewalls of the first plurality of trench segments;
    a second plurality of trench segments formed in the back surface of the substrate and extending partially through the substrate; and
    a second conductive layer formed on at least bottoms and sidewalls of the second plurality of trench segments.

14. The device of claim 13, wherein a maximum spacing between adjacent trench segments is configured to be smaller than a wavelength of RF signals being isolated by the integrated micro-shielding structure.

15. The device of claim 12, wherein the integrated micro-shielding structure comprises a plurality of vias formed from the back surface of the substrate and passing vertically at least partially through the substrate, the plurality of vias being filled with a conductive material to form a plurality of conductive pillars.

16. The device of claim 15, wherein a maximum spacing between adjacent conductive pillars is configured to be smaller than a wavelength of RF signals being isolated by the integrated micro-shielding structure.

17. The device of claim 12, further comprising a conductive layer formed on the back surface of the substrate, the conductive layer electrically connecting to the integrated micro-shielding structure and being configured to ground the integrated micro-shielding structure at one or more points through the semiconductor device.

18. A semiconductor device, comprising:
a substrate;
at least one functional circuit formed in the substrate; and
an integrated micro-shielding structure formed in the semiconductor device, the integrated micro-shielding structure extending vertically through the substrate between a front surface and a back surface of the substrate and surrounding the at least one functional circuit, the integrated micro-shielding structure being configured to reduce at least one of radio frequency (RF) emissions in the semiconductor device and RF coupling between different functional parts of the at least one functional circuit;
wherein the integrated micro-shielding structure comprises:
a first trench formed in the front surface of the substrate and extending at least partially through the substrate;
a first conductive layer formed on at least a bottom and sidewalls of the first trench;
a second trench formed in the back surface of the substrate and extending partially through the substrate;
a second conductive layer formed on at least a bottom and sidewalls of the second trench;
a first doped region formed proximate the first trench and extending into the substrate; and
a second doped region formed proximate the second trench and extending into the substrate, the first and second doped regions forming a contiguous doped region configured to electrically connect the first and second trenches.

19. A semiconductor device, comprising:
a substrate;
at least one functional circuit formed in the substrate; and
an integrated micro-shielding structure formed in the semiconductor device, the integrated micro-shielding structure extending vertically through the substrate between a front surface and a back surface of the substrate and surrounding the at least one functional circuit, the integrated micro-shielding structure being configured to reduce at least one of radio frequency (RF) emissions in the semiconductor device and RF coupling between different functional parts of the at least one functional circuit;
wherein the integrated micro-shielding structure comprises:
a first plurality of trench segments formed in the front surface of the substrate and extending partially through the substrate;
a first conductive layer formed on at least bottoms and sidewalls of the first plurality of trench segments;
a second plurality of trench segments formed in the back surface of the substrate and extending partially through the substrate;
a second conductive layer formed on at least bottoms and sidewalls of the second plurality of trench segments;
a first doped region formed proximate the first plurality of trench segments and extending into the substrate; and
a second doped region formed proximate the second plurality of trench segments and extending into the substrate, the first and second doped regions forming a contiguous doped region configured to electrically connect the first plurality of trench segments with the second plurality of trench segments.

20. A semiconductor device, comprising:
a substrate;
at least one functional circuit formed in the substrate;
an integrated micro-shielding structure formed in the semiconductor device, the integrated micro-shielding structure extending vertically through the substrate between a front surface and a back surface of the substrate and surrounding the at least one functional circuit, the integrated micro-shielding structure being configured to reduce at least one of radio frequency (RF) emissions in the semiconductor device and RF coupling between different functional parts of the at least one functional circuit;
a plurality of shallow trenches formed in the front surface of the substrate, in a scribe channel laterally separating first and second dies formed on the substrate;
a plurality of deep trenches formed in the back surface of the substrate on outer edges of the scribe channel, each of the deep trenches being formed beneath and vertically aligned with a corresponding one of the shallow trenches;
a first metal layer formed on the back surface of the substrate lining a bottom and sidewalls of the deep trenches; and
a second metal layer formed on sidewalls and a bottom of the shallow trenches.

* * * * *